(12) United States Patent
Ayranci et al.

(10) Patent No.: US 12,170,506 B2
(45) Date of Patent: Dec. 17, 2024

(54) LNA ARCHITECTURE WITH CONFIGURABLE FEEDBACK FILTERING

(71) Applicant: Murata Manufacturing Co., Ltd., Nagaokakyo (JP)

(72) Inventors: Emre Ayranci, Costa Mesa, CA (US); Mengsheng Rui, San Diego, CA (US); Miles Sanner, San Diego, CA (US); Anant Rungta, San Diego, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 77 days.

(21) Appl. No.: 18/147,607

(22) Filed: Dec. 28, 2022

(65) Prior Publication Data

US 2024/0223131 A1 Jul. 4, 2024

(51) Int. Cl.
*H03F 1/26* (2006.01)
*H03F 3/195* (2006.01)
*H03F 3/72* (2006.01)

(52) U.S. Cl.
CPC .............. *H03F 1/26* (2013.01); *H03F 3/195* (2013.01); *H03F 3/72* (2013.01); *H03F 2200/294* (2013.01); *H03F 2200/451* (2013.01)

(58) Field of Classification Search
CPC . H03F 1/26; H03F 3/193; H03F 3/195; H03F 3/72; H03F 2200/294; H03F 2200/451
USPC .............. 327/306, 363, 552, 553, 555, 556; 330/291, 294, 103, 109
See application file for complete search history.

(56) References Cited

U.S. PATENT DOCUMENTS

| 7,949,322 | B2* | 5/2011 | Kim ..................... H03F 3/45188 455/248.1 |
| 10,951,252 | B2 | 3/2021 | Ayranci et al. |
| 2011/0063035 | A1* | 3/2011 | Park ....................... H03F 1/223 330/291 |

(Continued)

FOREIGN PATENT DOCUMENTS

WO 2018/151437 A1 8/2018

OTHER PUBLICATIONS

International Search Report and Written Opinion issued for International PCT Application No. PCT/US2023/079545 filed on Nov. 13, 2023 on behalf of PSEMI Corporation. Mail Date: Mar. 22, 2024. 12 pages.

*Primary Examiner* — William Hernandez
(74) *Attorney, Agent, or Firm* — Steinfl + Bruno LLP

(57) ABSTRACT

A low noise amplifier (LNA) with configurable feedback that includes a filter circuit for improved stability is presented. The filter circuit includes an L-C tank. The filter circuit further includes a resistor in parallel with the L-C tank. The filter circuit is tunable/adjustable/programmable. The filter circuit further includes a capacitor selectively arranged in parallel with the L-C tank. The filter circuit is coupled to an input of the LNA via a series resistor. The filter circuit is coupled between the input and an output of the LNA via one or more switches. The LNA includes a first stage with a common-source transistor and a common-gate transistor. The LNA further includes a wideband feedback circuit coupled between the input and output of the first stage. The LNA includes a source-follower circuit. The source follower circuit is configurable as a second stage, or a feedback circuit, coupled to the filter circuit.

27 Claims, 13 Drawing Sheets

(56) References Cited

U.S. PATENT DOCUMENTS

| | | | |
|---|---|---|---|
| 2011/0102088 A1* | 5/2011 | Rajendran | H03F 3/191 |
| | | | 330/285 |
| 2016/0233836 A1 | 8/2016 | Kehrer et al. | |
| 2018/0191312 A1* | 7/2018 | Mu | H03F 3/195 |
| 2018/0205351 A1 | 7/2018 | Rada et al. | |
| 2018/0248526 A1* | 8/2018 | Lee | H03F 3/21 |
| 2020/0076372 A1 | 3/2020 | Schroegendorfer | |
| 2022/0140793 A1* | 5/2022 | Chen | H03F 3/19 |
| | | | 330/291 |
| 2022/0407469 A1 | 12/2022 | Ayranci et al. | |
| 2023/0188096 A1* | 6/2023 | Granger-Jones | H03F 3/3032 |
| | | | 330/311 |

\* cited by examiner

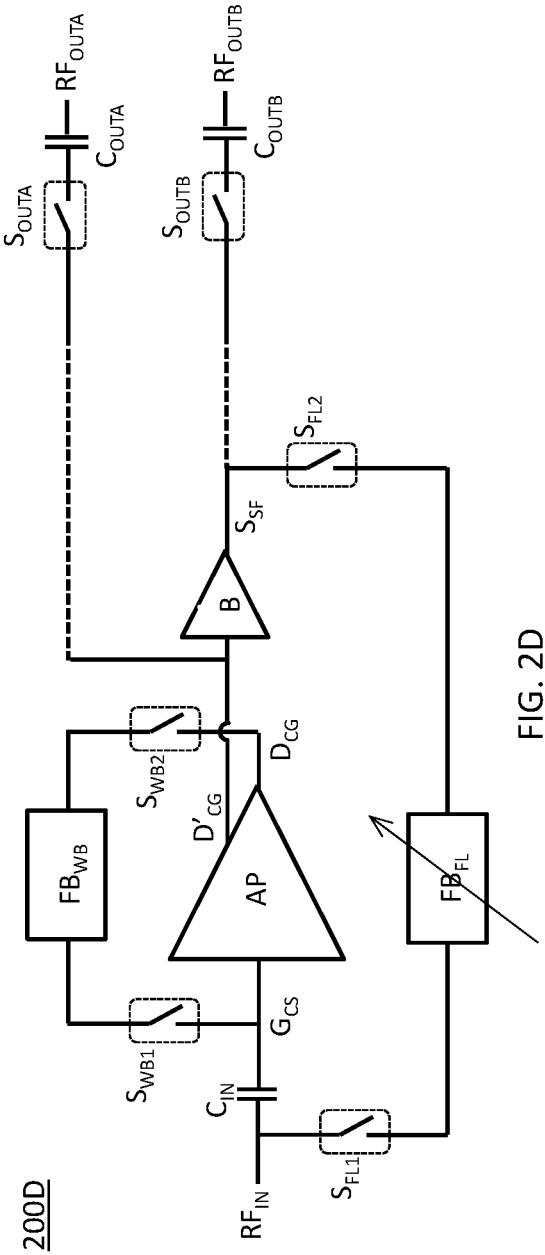
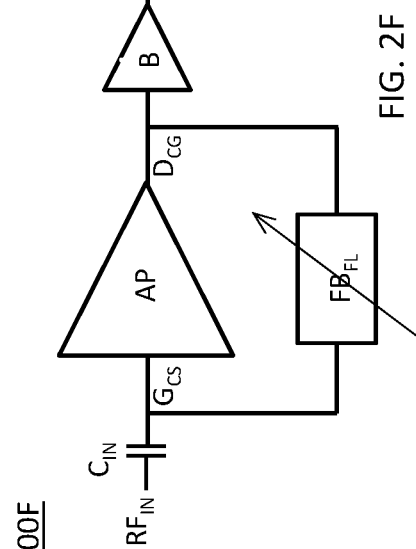
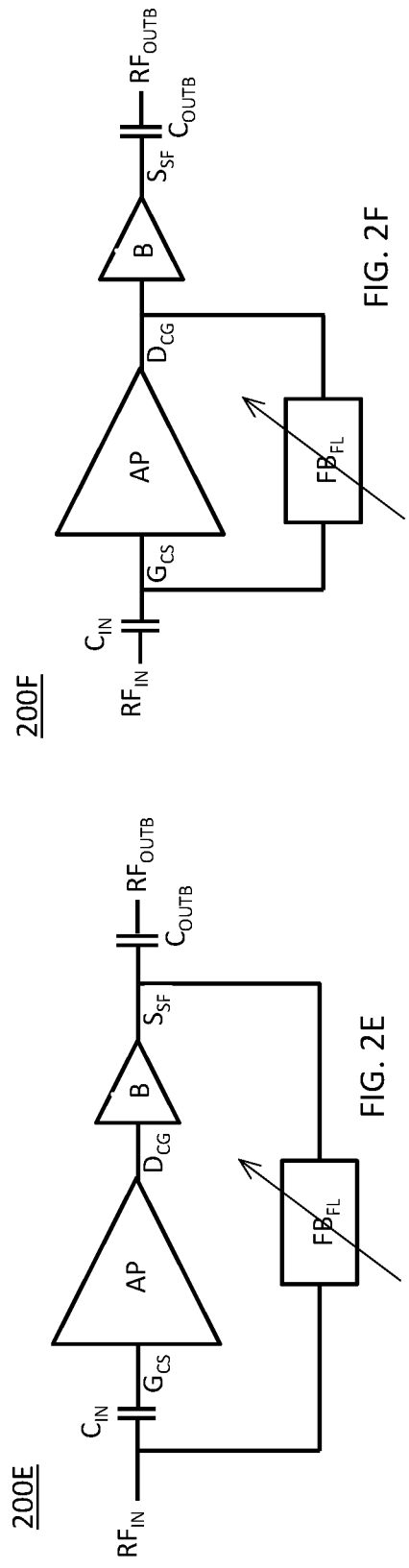

LNA ARCHITECTURE WITH CONFIGURABLE FEEDBACK FILTERING

TECHNICAL FIELD

The present disclosure is related to low noise amplifiers (LNAs), and more particularly to LNA architectures with configurable feedback filtering.

BACKGROUND

Processing of an input radio frequency (RF) signal through an RF system (e.g., RF frontend, RFFE) may be provided via a combination of switches, filters, and matching circuits, coupled to an amplifier, which in combination may provide an RF processing path for amplification of the input RF signal. In a traditional RFFE architecture used in, for example, a handheld device, different input RF signals corresponding to different frequency bands may require different, or differently configured, RF processing paths. When designing an RFFE module, circuit designers may be required to take into consideration cost versus performance tradeoff of the RFFE module while supporting the different frequency bands.

For example, FIG. 1A shows a prior art RFFE (receive side) architecture (100A) that uses a combined amplification path, CAP, for processing of all the supported frequency bands. Such frequency bands may include a plurality of (over-the-air) frequency bands (e.g., $B_a, B_b, \ldots, B_k$) and one or more auxiliary frequency bands (e.g., $AUX_1, AUX_2$). An RF signal corresponding to each of the frequency bands (e.g., $B_a, B_b, \ldots, B_k$) is received at the antenna, ANT, and is selectively routed through a respective filter (e.g., a, b, ..., k) of a filter bank, FB, via an antenna switch, ASW. A switch, B_SEL, selectively couples one of the supported frequency bands (e.g., $B_a, B_b, \ldots, B_k, AUX_1, AUX_2$ coupled to respective throws of the switch B_SEL) to the combined amplification path, CAP (e.g., coupled to the single pole of the switch B_SEL). For example, as shown in FIG. 1A, the switch, B_SEL, may couple an RF signal, $RF_{SEL}$, corresponding to the selected frequency band, Bu, to an input matching circuit, IM, of the combined amplification path, CAP. In turn, an amplifier, AP, and an output matching circuit, OM, of the combined amplification path, CAP, may further process the RF signal, $RF_{SEL}$, for output of an amplified output RF signal, $RF_{OUT}$. The prior art RFFE architecture (100A) of FIG. 1A reduces cost of a corresponding RFFE module by reducing a number of components required for processing of the supported frequency bands (e.g., $B_a, B_b, \ldots, B_k, AUX_1, AUX_2$). Such cost reduction however may come at the expense of performance degradation (e.g., noise figure) of the RFFE architecture (100A) due, for example, to an insertion loss (inherent) of the switch, B_SEL.

The exemplary prior art RFFE architecture (100B) of FIG. 1B increases performance of a corresponding RFFE module by providing a dedicated RF amplification path (e.g., $DAP_a, DAP_b, \ldots, DAP_k, DAP_1, DAP_2$) for each of the supported frequency bands (e.g., $B_a, B_b, \ldots, B_k, AUX_1, AUX_2$). Use of such dedicated amplification paths (e.g., $DAP_a, DAP_b, \ldots, DAP_k, DAP_1, DAP_2$, coupled to a same output matching circuit, OM) may remove requirement for the switch, B_SEL, of the RFFE architecture (100A) of FIG. 1A, and therefore may improve a noise figure (NF) performance of the RFFE architecture (100B). Furthermore, a dedicated input matching circuit (e.g., $IM_a, IM_b, \ldots, IM_k, IM_1, IM_2$ of a bank of input matching circuits, IMB) and a dedicated amplifier (e.g., $AP_a, AP_b, \ldots, AP_k, AP_1, AP_2$ of a bank of amplifiers, APB) of the dedicated RF amplification paths (e.g., $DAP_a, DAP_b, \ldots, DAP_k, DAP_1, DAP_2$) may allow increased flexibility in optimizing a performance (e.g., matching, gain, power, linearity, etc.) of the RFFE architecture (100B) with respect to a specific frequency band of the supported frequency bands (e.g., $B_a, B_b, \ldots, B_k, AUX_1, AUX_2$). The increased performance provided by the prior art RFFE architecture (100B) of FIG. 1B over the prior art RFFE architecture (100A) of FIG. 1A may be associated with an increased cost of components used in the dedicated RF amplification paths (e.g., $DAP_a, DAP_b, \ldots, DAP_k, DAP_1, DAP_2$) and an increase in die area, and therefore a (physical) size and cost, of a corresponding RFFE module.

Common to both prior art architectures (100A) and (100B) is the requirement for specific band filters (e.g., a, b, ..., k of the filter bank, FB) whose responses are tailored to respective frequency contents of the frequency bands (e.g., in-band) and distance/separation between such frequency bands. As emergence of new communication standards (e.g., 5G NR) may define narrower and closer frequency bands, new and more challenging requirements may be imposed on the performance of the band filters that may invariably increase cost and physical size (e.g., increased number of filter stages) of the band filters. A motivation of the present teachings is to relax performance requirements of the band filters used in an RFFE module.

SUMMARY

According to a first aspect of the present disclosure, a low noise amplifier (LNA) circuit is presented, comprising: a first amplification stage configured to receive an input radio frequency (RF) signal at an input of the first amplification stage and generate therefrom an amplified RF signal at an output of the first amplification stage; and a filter circuit comprising an L-C tank, the filter circuit coupled between the output and the input of the first amplification stage, wherein the L-C tank is configured to resonate at a resonant frequency to provide a narrowband frequency response of the LNA circuit.

According to a second aspect of the present disclosure, a low noise amplifier (LNA) circuit is presented, comprising: a first amplification stage comprising a common-source amplifier in series connection with a common-gate amplifier; and a filter circuit comprising an L-C tank, the filter circuit coupled between a drain of the common-gate amplifier and a gate of the common-source amplifier, wherein the L-C tank is configured to resonate at a resonant frequency to provide a narrowband frequency response of the LNA circuit.

According to a third aspect of the present disclosure, a low noise amplifier (LNA) circuit is presented, comprising: a first amplification stage comprising a common-source amplifier in series connection with a common-gate amplifier; a second amplification stage comprising a source-follower, an input to the second amplification stage coupled to the drain of the common-gate amplifier; and a filter circuit comprising an L-C tank, the filter circuit coupled between an output of the second amplification stage and a gate of the common-source amplifier, wherein the L-C tank is configured to resonate at a resonant frequency to provide a narrowband frequency response of the LNA circuit.

Further aspects of the disclosure are provided in the description, drawings and claims of the present application.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 2D shows a simplified block diagram of a multi-stage stage LNA architecture with feedback filtering according to another embodiment of the present disclosure.

FIG. 2E shows a simplified block diagram of a multi-stage stage LNA architecture with feedback filtering according to yet another embodiment of the present disclosure.

FIG. 2F shows a simplified block diagram of a multi-stage stage LNA architecture with feedback filtering according to yet another embodiment of the present disclosure.

Like reference numbers and designations in the various drawings indicate like elements.

DETAILED DESCRIPTION

As known in the art, a bandwidth of an RF system (e.g., an RF amplifier) may be defined in terms of percentage bandwidth, provided by a ratio (in percentage) of the absolute bandwidth to the center frequency at which the RF system operates. One performance metric of RF amplifiers associated with the bandwidth is represented by gain flatness over the specified bandwidth. Gain flatness is typically specified in dB, indicating the gain variation over the frequency range of operation.

Throughout the present disclosure, the term "Narrowband" may be used to describe applications where the frequency range of operation represents a percentage bandwidth of less than 7.5%; the term "Extended Narrowband" may be used to describe applications where the frequency range of operation represents a percentage bandwidth between 7.5% and 15%; and the term "Wideband" may be used to describe applications where the frequency range of operation represents a percentage bandwidth more than 15%.

Throughout the present disclosure, the expressions "common-source amplifier", "common-drain amplifier" and "common-gate amplifier" refer to the well-known in the art three basic single-stage field-effect transistor (FET, MOSFET) topologies. For example, the common-source amplifier may be used as a voltage or transconductance amplifier; the common-drain amplifier, also known as a "source follower", may be used as a voltage buffer; and the common-gate amplifier may be used as current buffer or voltage amplifier. As it is well known in the art, an output of a common-source amplifier may be coupled to one or more series connected common-gate amplifiers according to a cascode configuration (e.g., first stage 110 of FIG. 1D later described).

Figure 1A:
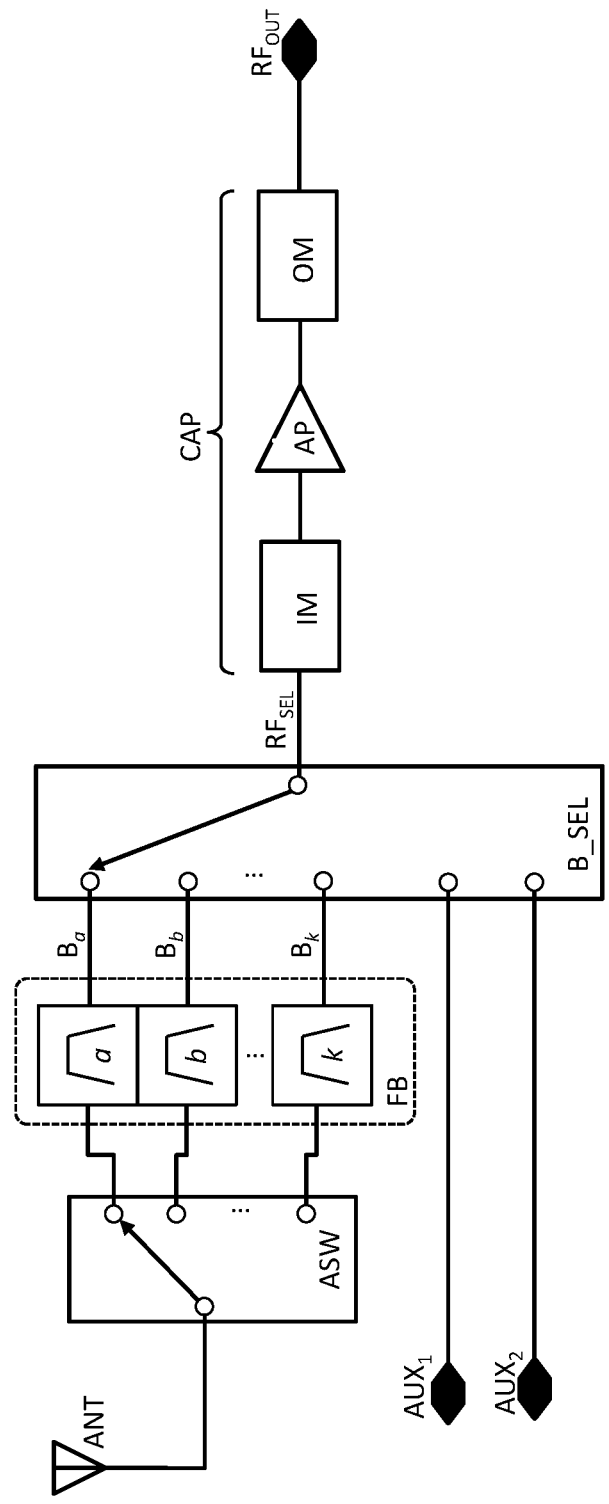
FIG. 1A shows a simplified schematic of a prior RFFE architecture.
Figure 1B:
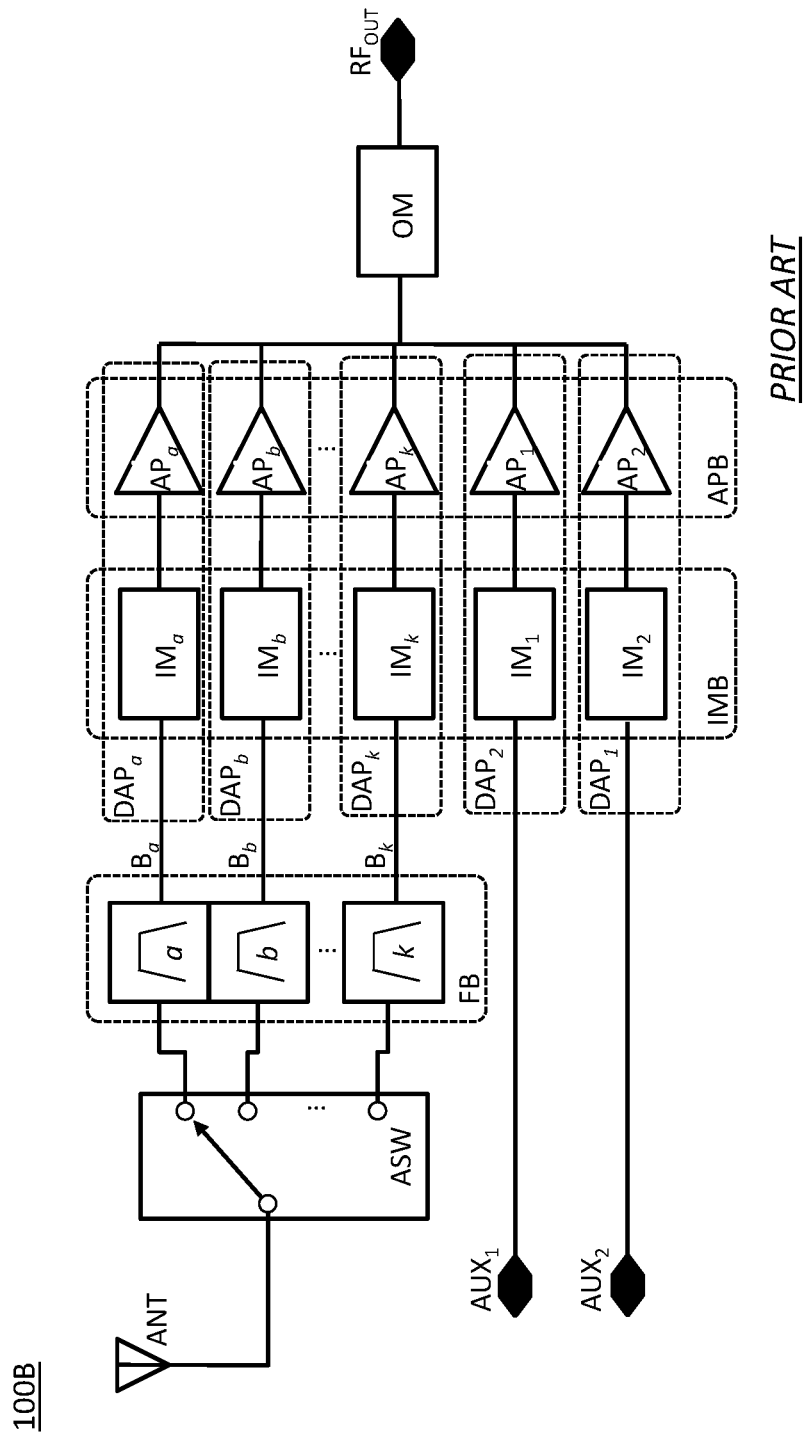
FIG. 1B shows a simplified schematic of another prior RFFE architecture.
Figure 1C:
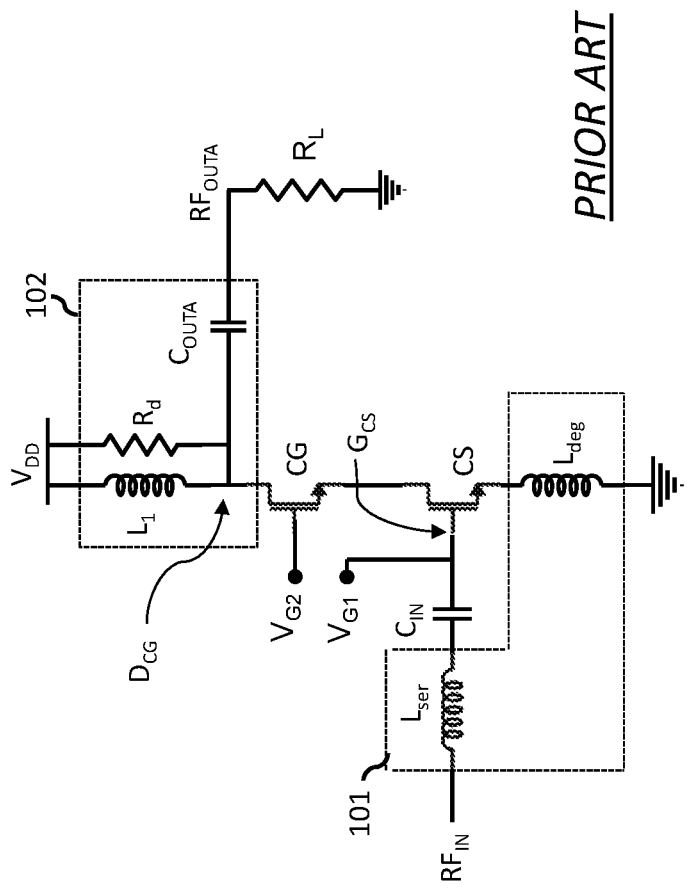
FIG. 1C shows a simplified schematic of a single-stage prior art low noise amplifier (LNA).

FIG. 1C shows a prior art (single-stage) low noise amplifier (LNA, 100C) that may be used, for example, in a receiver front-end portion of an RF communication system, such as, for example, the RFFE (100A of FIG. 1A) or (100B of FIG. 1B). The LNA (100C) comprises a stacked transistor amplifying arrangement (e.g., amplifier) including an input transistor CS (configured as a common-source device or amplifier) and a cascode output transistor CG (configured as a common-gate device or amplifier), an input match circuit (101) coupled to the input transistor CS, and an output match circuit (102) coupled to the output transistor CG. The input match circuit (101) may comprise a series connected input inductor (e.g., $L_{ser}$) coupled to a gate of the input transistor CS, and/or a degenerative inductor (e.g., $L_{deg}$) coupled to a source of the common-source input transistor CS. It should be noted that the input match circuit (101) may include other elements, such as, for example, a series capacitor and/or a shunting inductor (not shown). The output match circuit (102) may comprise an inductor, $L_1$, optionally in parallel connection with a resistor (e.g., $R_d$), and a capacitor, $C_{OUTA}$, the output match circuit (102) providing an impedance match to a load $R_L$. The capacitor, $C_{OUTA}$, may further serve as a DC blocking capacitor to decouple a DC voltage (e.g., based on the supply voltage, $V_{DD}$) present at a drain of the output transistor CG from a DC voltage present at the load $R_L$. Likewise, a capacitor $C_{IN}$ coupled to a gate of the input transistor CS may serve as a DC blocking capacitor to decouple a DC voltage present at a gate of the input transistor CS from a DC voltage present at a circuit feeding the input RF signal, $RF_{IN}$, to the input transistor CS. Furthermore, the (optional) resistor, $R_d$, may be used for deQing (e.g., lowering q-factor) the output match circuit (102) to provide a wideband mode of operation of the LNA (100C). Such deQing of the output match circuit (102) may result in a lower gain of the LNA (100A), thereby potentially impacting the overall system performance of the receiver. It should be noted that operation of the cascode stack (CS, CG) may be based on gate biasing voltages ($V_{G1}$, $V_{G2}$) provided to the gates of the transistors (CS, CG) as shown in FIG. 1C. Generation of such gate biasing voltage is well known in the art and outside the scope of the present disclosure. Accordingly, presence of such gate biasing voltages should be considered as implied throughout the various LNA architectures described in the present disclosure.

Figure 1D:
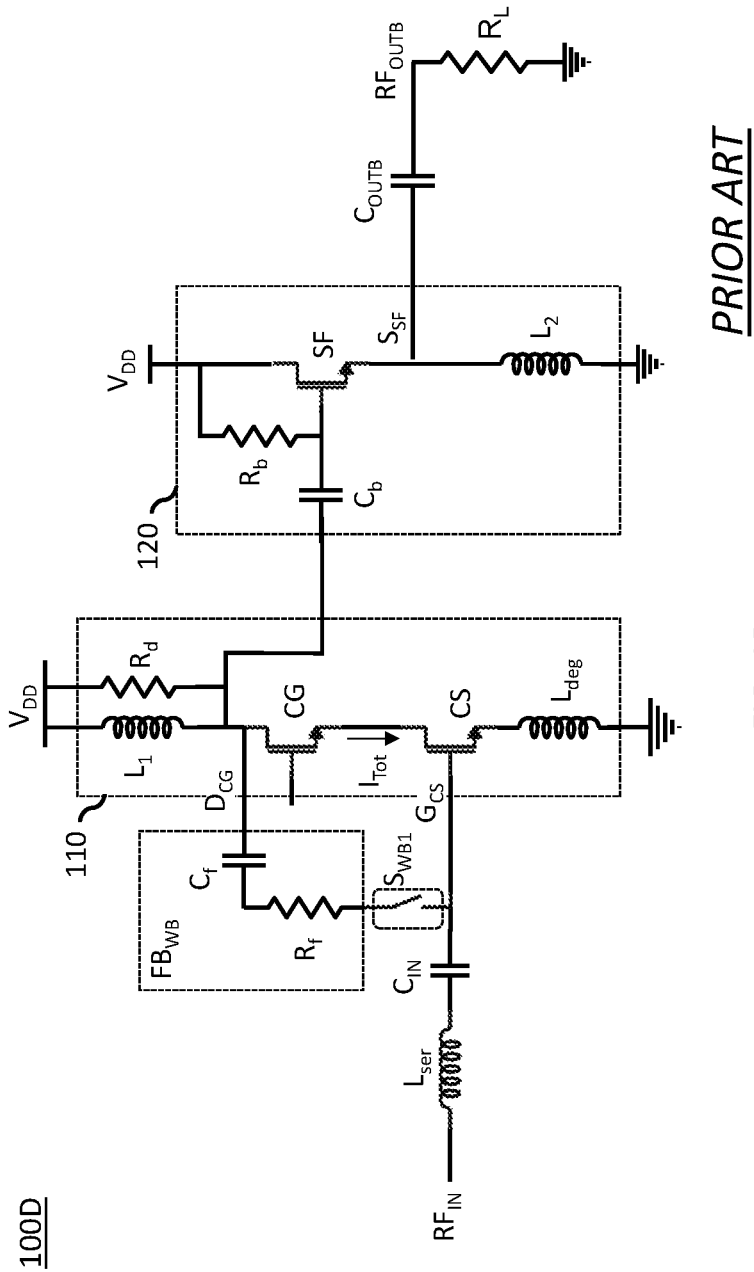
FIG. 1D shows a simplified schematic of a multi-stage prior art LNA with improved wideband performance.

FIG. 1D shows a prior art multi-stage LNA amplifier (100D), including a first stage (110) that is based on the single-stage cascode configuration (100C) of FIG. 1C, and a second stage (120), that in combination can provide an increased performance for wideband operation. The multi-stage LNA amplifier (100D) comprises a feedback circuit, $FB_{WB}$, comprising a resistor $R_f$ in series connection with a capacitor $C_f$, that can be selectively switched in (or out) the first stage (110) by closing (or opening) a series-connected switch, $S_{WB1}$. When switched in, the resistor $R_f$ of the feedback circuit, $FB_{WB}$, provides a feedback path between an output node, $D_{CG}$, and an input node, $G_{CS}$, of the first stage (110), thereby increasing the bandwidth of the first stage (110). The capacitor $C_f$ of the feedback circuit, $FB_{WB}$, serves as a DC de-coupling capacitor between the output node $D_{CG}$ (provided at the drain of the output transistor CG) and the input node $G_{CS}$ (provided at the gate of the input transistor CS), but may also be used for (frequency) tuning of the feedback circuit, $FB_{WB}$.

Because an output impedance of the first stage (110) of FIG. 1D may be different for each state of the switch $S_{WB1}$, output matching to the load $R_L$ is now achieved by using a second stage (120) that is cascaded to the first stage (110). As can be seen in FIG. 1D, the second stage (120) may be a source follower circuit (120) that includes a transistor SF and an inductor (e.g., $L_2$) coupled to a source of the transistor SF. Furthermore, a resistor Rb may provide a DC biasing voltage to a gate of the transistor SF, and a capacitor $C_b$ may be used as a DC blocking capacitor between the first stage (110) and the second stage (120). As known to a person skilled in the art, an output impedance of the source follower (seen into the source of the transistor SF) is equal to $1/g_m$ where $g_m$ represents the transconductance of the transistor SF. Because such transconductance is practically frequency independent, it can therefore provide an improved output matching for wideband operation and irrespective of the configuration/state of the switch $S_{WB1}$. It should be noted that as shown in FIG. 1D, a capacitor, $C_{OUTB}$, may be coupled between an output node, $S_{SF}$, of the source follower circuit (120, source of transistor SF) and the load $R_L$, mainly to block a DC voltage present at the output of the source follower circuit (120). In other words, and in contrast to the capacitor $C_{OUTA}$ of the configuration (100C) of FIG. 1C, the capacitor $C_{OUTB}$ may not be used for matching purposes.

The feedback circuit, $FB_{WB}$, of the multi-stage LNA amplifier (100D) may therefore allow selection of a bandwidth of the amplifier with impact on a gain of the amplifier. When the LNA (100D) is used in a receiver front-end of an RF communication system (e.g., 100A of FIG. 1A or 100B of FIG. 1B), filtering for operation according to a specific frequency band must be provided by a corresponding band filter (e.g., a, b, ..., k of the filter bank, FB, of FIGS. 1A-1B).

Teachings according to the present disclosure further provide filtering functionality built into the LNA. According to some embodiments of the present disclosure, such filtering functionality may be in addition to a bandwidth selection functionality (e.g., as provided by the LNA 100D of FIG. 1D). According to some embodiments of the present disclosure, such filtering functionality may operate independently from the bandwidth selection functionality. According to some embodiments of the present disclosure, such filtering functionality may be provided without a bandwidth selection functionality (e.g., added to LNA 100C of FIG. 1C). According to some embodiments of the present disclosure, the filter functionality and a wideband functionality may be permanent features of the LNA (e.g., non-selectable). According to some embodiments of the present disclosure, such filtering functionality may be selectively activated (e.g., included) or deactivated (e.g., excluded). According to some embodiments of the present disclosure, when activated or present, such filtering functionality may be tunable to (affect or operate on) different frequency bands. According to some embodiments of the present disclosure, when activated or present, such filtering functionality may further provide (signal) matching functionality, such as, for example, input matching to the LNA.

The LNA with built-in filtering functionality according to the present disclosure may include a single- or multi-stage LNA. According to some embodiments of the present disclosure, the filtering functionality may be provided by a filter circuit that may be selectively coupled to the LNA. According to some embodiments of the present disclosure, the filter circuit may be selectively coupled between an input and an output of the LNA. According to some embodiments of the present disclosure, the filter circuit may be selectively coupled to an output of a first stage of a single- or multi-stage LNA. According to some embodiments of the present disclosure, the filter circuit may be selectively coupled to an output of a second stage of a multi-stage LNA.

By providing a filtering functionality that is built into the LNA, teachings according to the present disclosure may allow relaxing of performances, or even removal, of the band filters (e.g., a, b, ..., k of the filter bank FB of FIGS. 1A-1B). This in turn may benefit/reduce insertion loss and noise figure performance of the RF system (e.g., RFFE) in exchange of a relatively low cost and physical size of the added filter circuit. Other associated benefits of including the filtering functionality into the LNA, may include improved linearity when compared to traditional LNA designs, filtering configurability/tunability with respect to different frequency bands across different communication standards, including for wideband or narrowband operation, and built-in matching (as part of the filter circuit) for better overall linearity performance.

Figure 2A:
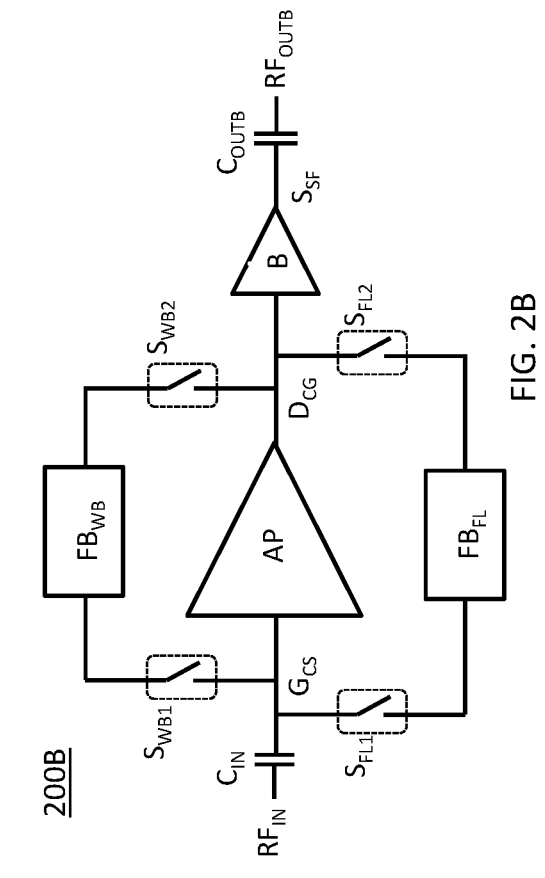
FIG. 2A shows a simplified block diagram of a single-stage LNA architecture with feedback filtering according to an embodiment of the present disclosure.

FIG. 2A shows a simplified block diagram of a single-stage low noise amplifier (LNA) architecture with feedback filtering (200A) according to an embodiment of the present disclosure. As shown in FIG. 2A, the LNA (200A) may include an amplifier, AP, with a (wideband) feedback circuit, $FB_{WB}$, selectively coupled between input and output nodes, $G_{CS}$ and $D_{CG}$, of the amplifier, AP. Furthermore, input and output RF signals, $RF_{IN}$ and $RF_{OUT}$, may be coupled to respective nodes, $G_{CS}$ and $D_{CG}$, via respective capacitors, $C_{IN}$ and $C_{OUT}$. The amplifier, AP, may be, for example, the amplifier (100C) described above with reference to FIG. 1C, and the (wideband) feedback circuit, $FB_{WB}$, may be, for example, according to the feedback circuit described above with reference to FIG. 1D. In other words, based on the above description with reference to FIGS. 1C-1D, a person skilled in the art would realize that the combination of (AP, $FB_{WB}$) may provide (selective) operation according to a wideband or narrowband mode of operation of the LNA (200A), selectively provided via ON/OFF control of one or more switches (e.g., $S_{WB1}$, $S_{WB2}$) that couple the (wideband) feedback circuit, $FB_{WB}$, to one or more of the nodes, $G_{CS}$ or $D_{CG}$.

With continued reference to FIG. 2A, the LNA (200A) according to the present disclosure may further include a filter circuit, $FB_{FL}$, that may be selectively coupled between the input and output nodes, $G_{CS}$ and $D_{CG}$, of the amplifier, AP. As shown in FIG. 2A, selective coupling of the filter circuit, $FB_{FL}$, to the amplifier AP may be provided by one or more switches (e.g., $S_{FL1}$, $S_{FL2}$) that selectively couple the filter circuit, $FB_{FL}$, to one or more of the nodes, $G_{CS}$ or $D_{CG}$. Because coupling of the circuits $FB_{WB}$ and $FB_{FL}$ to the amplifier AP is provided via different switches, independent activation and deactivation of a wideband mode of operation or a/an (internal) filtering mode of operation of the LNA (200A) may be provided. This may include simultaneous coupling of the circuits $FB_{WB}$ and $FB_{FL}$ to the amplifier AP, or coupling only one of the circuits $FB_{WB}$ or $FB_{FL}$ to the amplifier AP. It should be noted that although two switches are shown for selective coupling to the amplifier AP of each of the circuits $FB_{WB}$ or $FB_{FL}$, in some embodiments a single switch may be provided. Accordingly, activation/deactivation of the wideband/filtering mode of operation of the LNA (200A) may correspond to enabling/disabling a current conduction path (flow) between nodes $G_{CS}$ and $D_{CG}$ through the circuit $FB_{WB}/FB_{FL}$. Although not shown in FIG. 2A, it should be noted that the filter circuit, $FB_{FL}$, may be tunable/adjustable/settable/programmable (e.g., $FB_{FL3}$, $FB_{FL4}$ of FIG. 3 later described) so to provide different frequency responses of a corresponding filter.

Figure 2B:
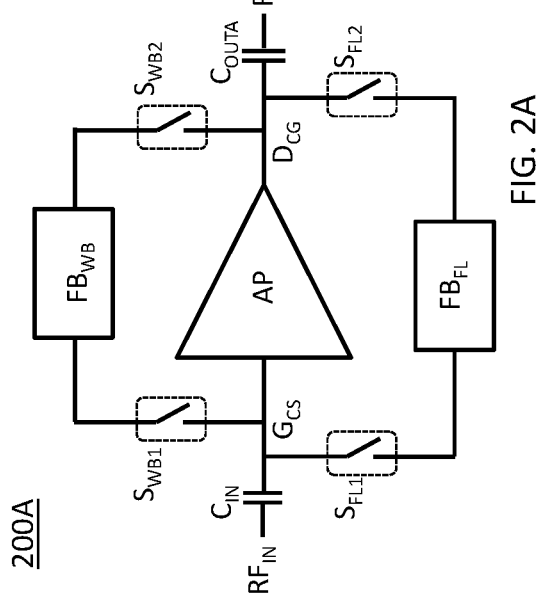
FIG. 2B shows a simplified block diagram of a single-stage LNA architecture with feedback filtering according to another embodiment of the present disclosure.
Figure 5:
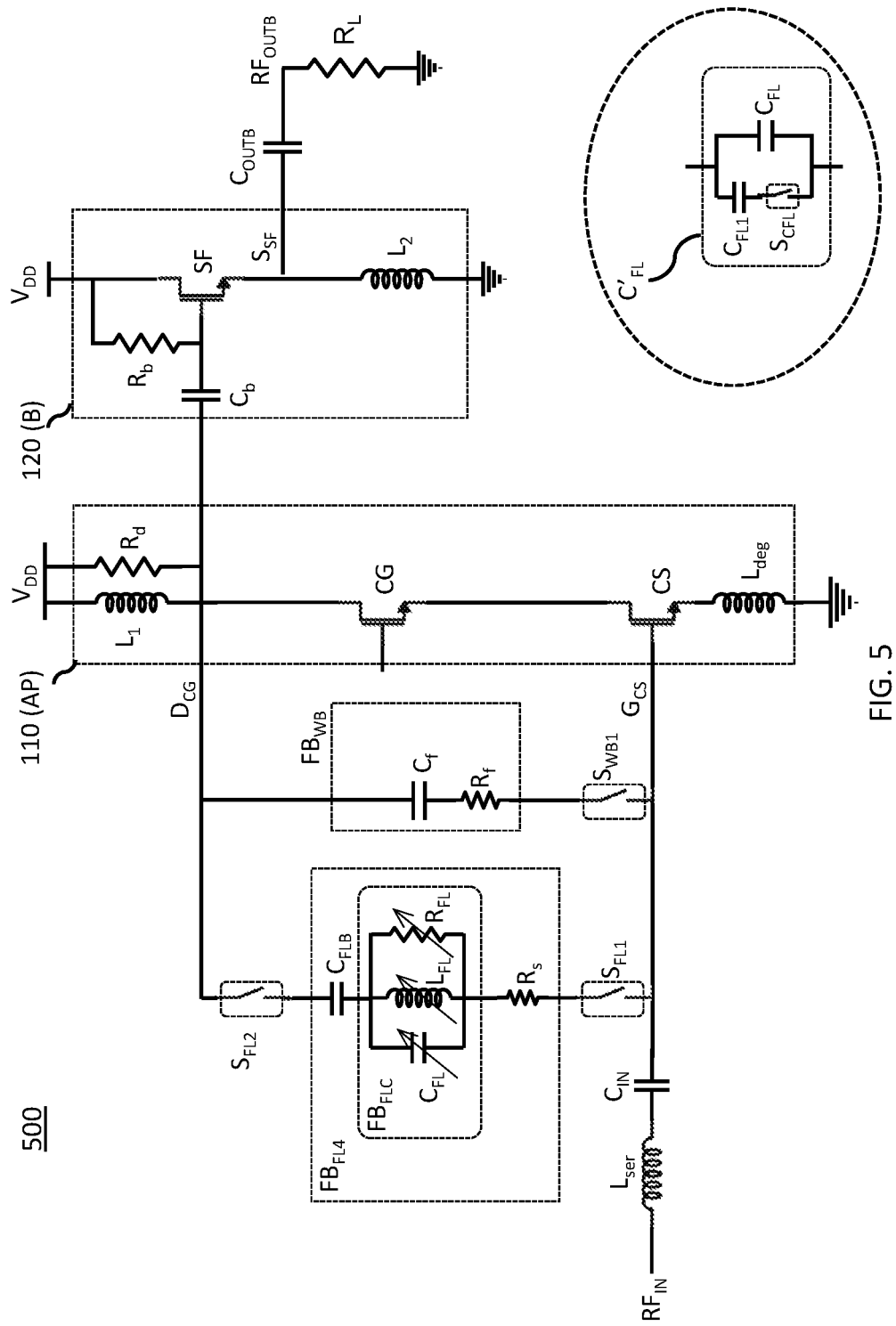
FIG. 5 shows a simplified schematic of a multi-stage stage LNA architecture with feedback filtering according to an embodiment of the present disclosure.

FIG. 2B shows a simplified block diagram of a multi-stage low noise amplifier (LNA) architecture with feedback filtering (200B) according to another embodiment of the present disclosure. The LNA (200B) includes a configuration that is similar to the LNA (200A) of FIG. 2A, which selectively couples the circuits $FB_{WB}$ or $FB_{FL}$ to the nodes $G_{CS}$ and $D_{CG}$ of the amplifier AP used as a first stage of the LNA (200B). However, differently from the LNA (200A) of FIG. 2A, an output RF signal, $RF_{OUTB}$, of the LNA (200B) is provided at an output node, $S_{SF}$, of a second stage (amplifier), B, of the LNA (200B), input to the second stage coupled to the node $D_{CG}$. According to some embodiments, the second stage, B, may be same as the second stage (120, source follower) described above with reference to FIG. 1D for providing similar benefits for output matching of the LNA (200B). Exemplary implementations of the LNA (200B) are shown in FIG. 5 (selective operation) and FIG. 6 (permanent and tunable operation without support for wideband mode of operation) later described.

Figure 2C:
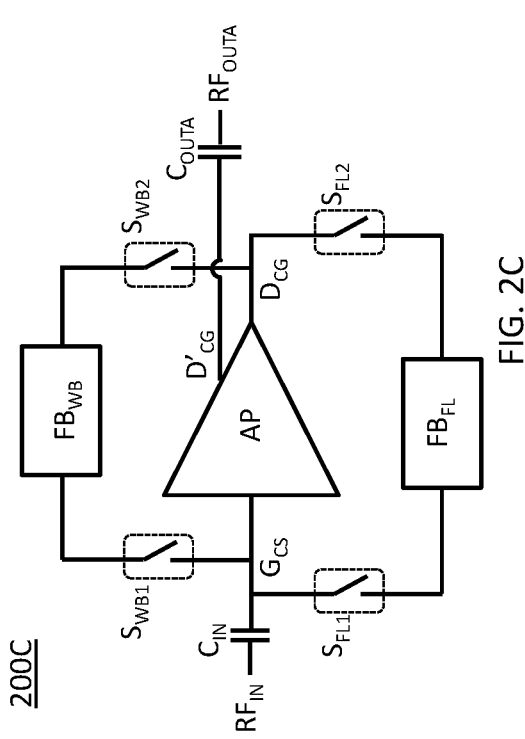
FIG. 2C shows a simplified block diagram of a multi-stage stage LNA architecture with feedback filtering according to an embodiment of the present disclosure.
Figure 7:
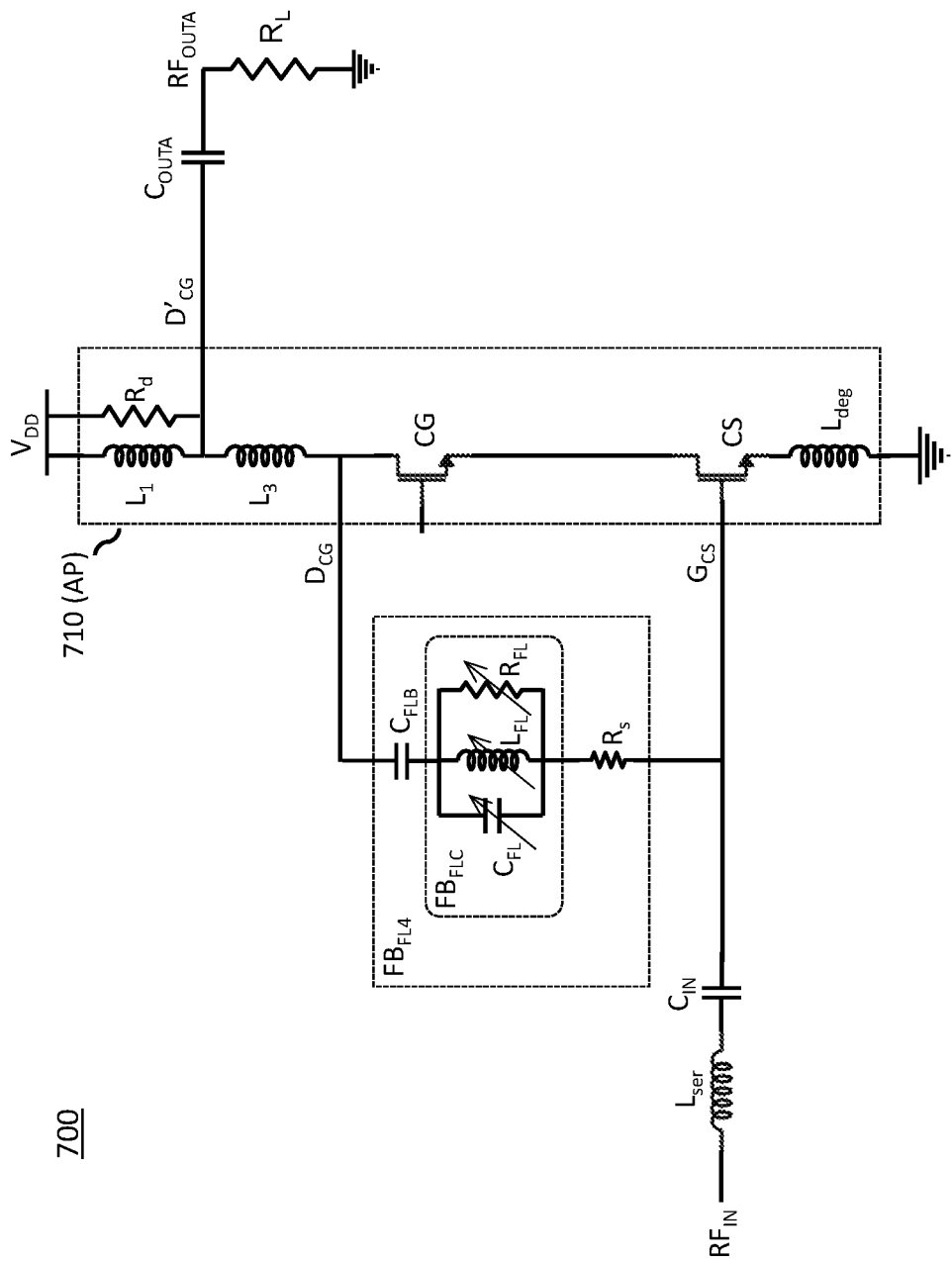
FIG. 7 shows a simplified schematic of a single-stage stage LNA architecture with feedback filtering according to an embodiment of the present disclosure.

FIG. 2C shows a simplified block diagram of a single-stage low noise amplifier (LNA) architecture with feedback filtering (200C) according to another embodiment of the present disclosure. The LNA (200C) includes a configuration that is similar to the LNA (200A) of FIG. 2A, which selectively couples the circuits $FB_{WB}$ or $FB_{FL}$ to the nodes $G_{CS}$ and $D_{CG}$. However, differently from the LNA (200) of FIG. 2A, an output RF signal, $RF_{OUTA}$, of the LNA (200C) is provided at a node, $D'_{CG}$, that is different from the node $D_{CG}$. According to some embodiments, the node $D'_{CG}$ may be coupled to the node $D_{CG}$ via a reactive element (e.g., inductor as shown for example in FIGS. 7-9 later described) to provide a better output matching of the LNA (200C) while reducing effect of coupling/decoupling (or tuning) of the circuits $FB_{WB}$ or $FB_{FL}$ on an impedance presented by the node $D_{CG}$. An exemplary implementation of the LNA (200C) is shown in FIG. 7 (permanent and tunable operation without support for wideband mode of operation) later described.

FIG. 2D shows a simplified block diagram of a multi-stage LNA architecture with feedback filtering (200D) according to another embodiment of the present disclosure. In the configuration of FIG. 2D, feedback for the wideband mode of operation of the LNA (200D) may be provided via coupling, such as a selective coupling, of the circuit $FB_{WB}$ between nodes $G_{CS}$ and $D_{CG}$ of the first stage (amplifier), AP. On the other hand, feedback for the filtering mode of operation may be provided via coupling, such as a selective coupling, of the (e.g., tunable) circuit $FB_{FL}$ between an input of the first stage AP and an output of the second stage, B. In particular, as shown in FIG. 2D, the circuit $FB_{FL}$ may be selectively coupled to the node $G_{CS}$ through the capacitor, $C_{IN}$, and to the node $S_{SF}$. Furthermore, as shown in FIG. 2D, the input to the second stage, B, may be coupled to the (above described) node $D'_{CG}$ of the first stage, AP. By coupling the circuit $FB_{FL}$ to node $G_{CS}$ through the capacitor, $C_{IN}$, as shown in FIG. 2D, the circuit $FB_{FL}$ may be further configured to affect/control input matching to the LNA (200D) during the narrowband mode of operation.

Figure 8:
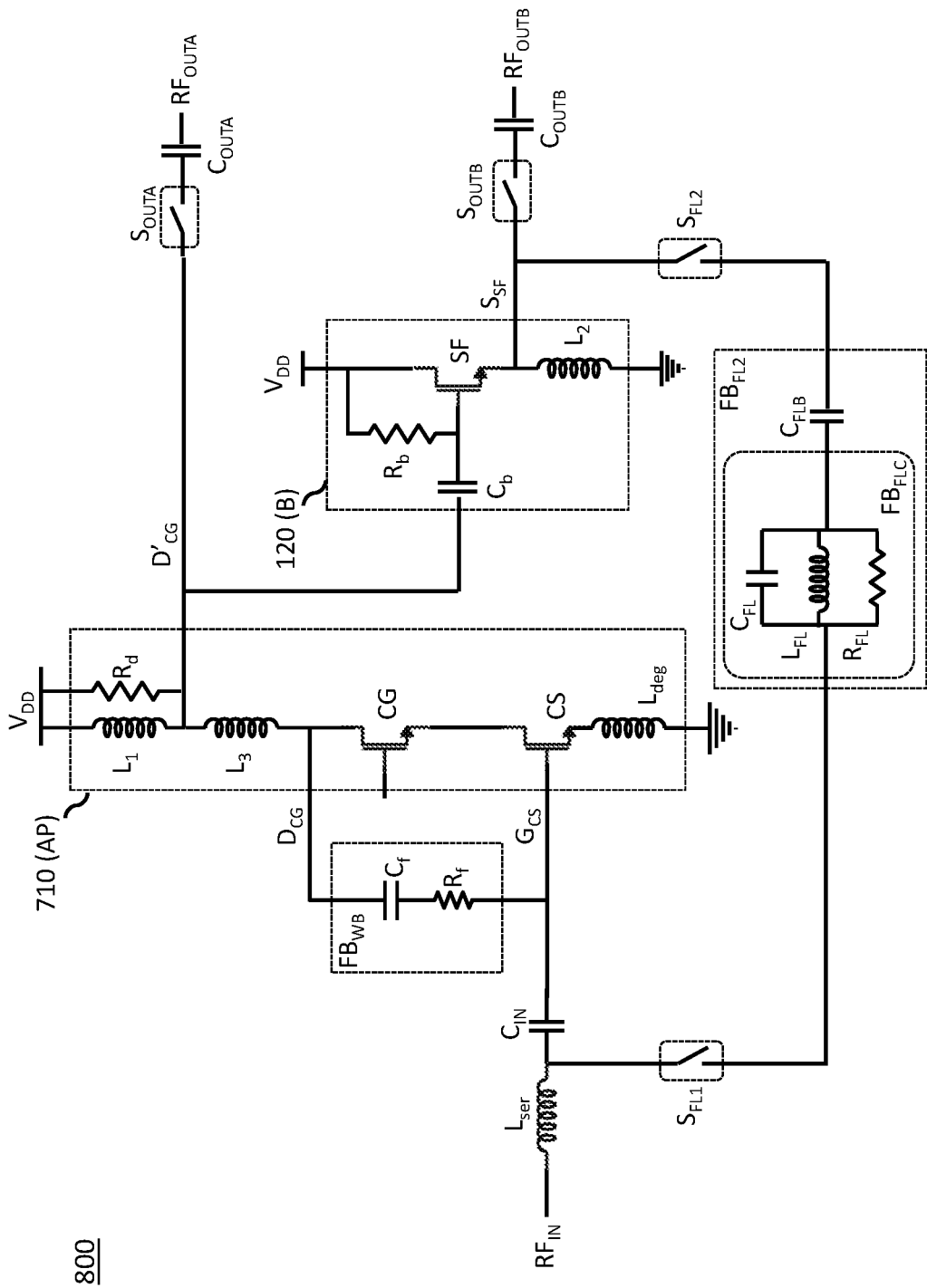
FIG. 8 shows a simplified schematic of a configurable single- or multi-stage stage LNA architecture with feedback filtering according to another embodiment of the present disclosure.
Figure 9:
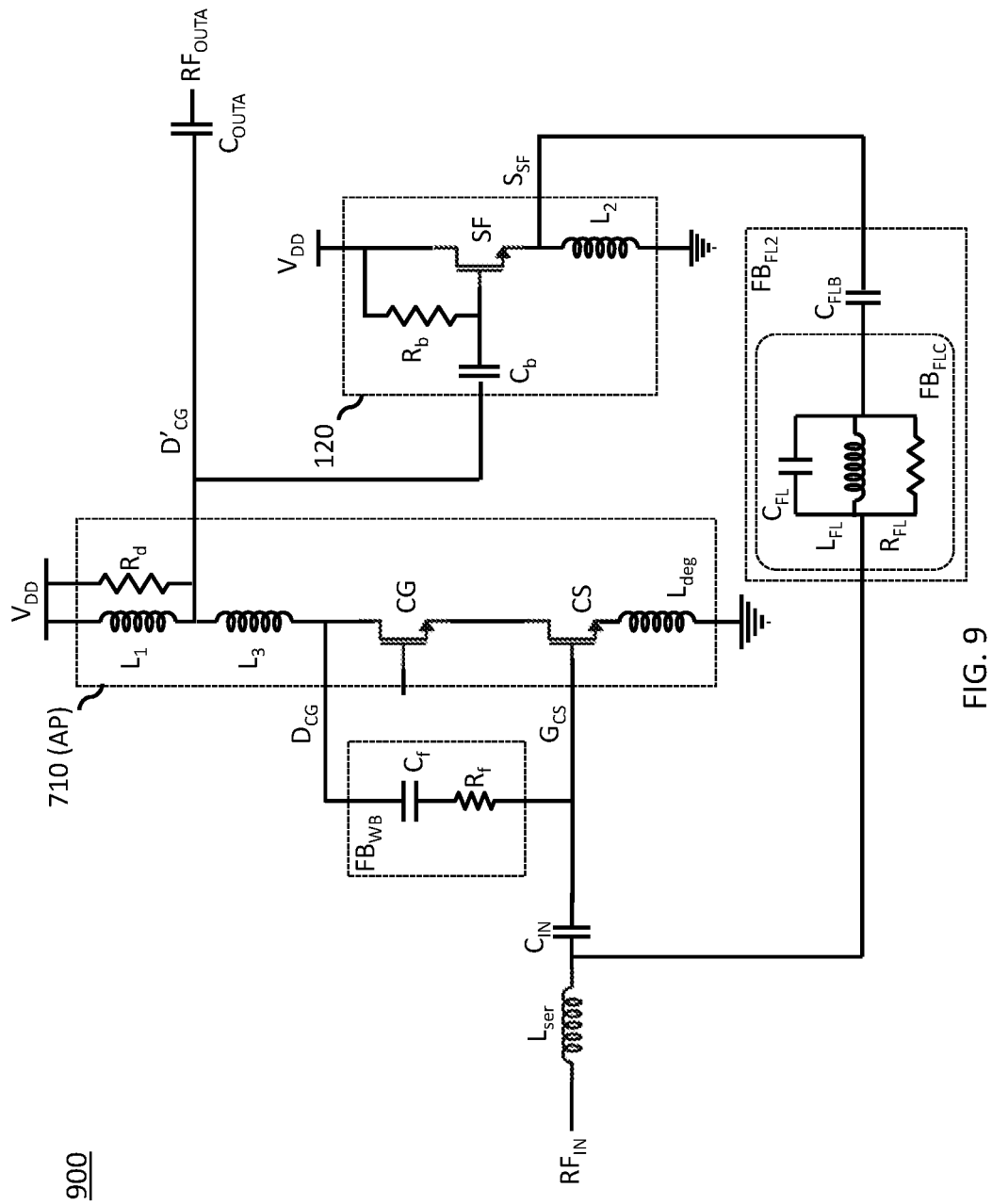
FIG. 9 shows a simplified schematic of a single-stage stage LNA architecture with feedback filtering according to another embodiment of the present disclosure.

With continued reference to FIG. 2D, exemplary implementations of the LNA (200D) are shown in FIG. 8 and FIG. 9 later described. It should be noted that as previously described, coupling of the circuits $FB_{WB}$ and/or $FB_{FL}$ to amplification stages of the LNA according to the present teachings may be selective via one or more switches (e.g., $S_{WB1}$, $S_{WB2}$, $S_{FL1}$, $S_{FL2}$), or may be permanent and therefore not based a on state of a switch. In other words, presence of the various switches shown in FIGS. 2A-2D may be considered optional and therefore not as limiting the scope of the present disclosure. Accordingly, considering an exemplary implementation of the LNA (200D) wherein the circuit $FB_{WB}$ is permanently coupled (i.e., not through a switch) to the first amplification stage, AP, then the input to the second stage, B, may be provided directly at the node $D_{CG}$ of the first stage, AP (instead of $D'_{CG}$). Same may apply, as shown in configurations (200E) of FIG. 2E and (200F) of FIG. 2F, to a configuration that is devoid of any switch that may alter (e.g., in dependance of a state of the switch) an impedance seen at an output node (e.g., $D_{CG}$) of the first stage, AP.

Figure 3:
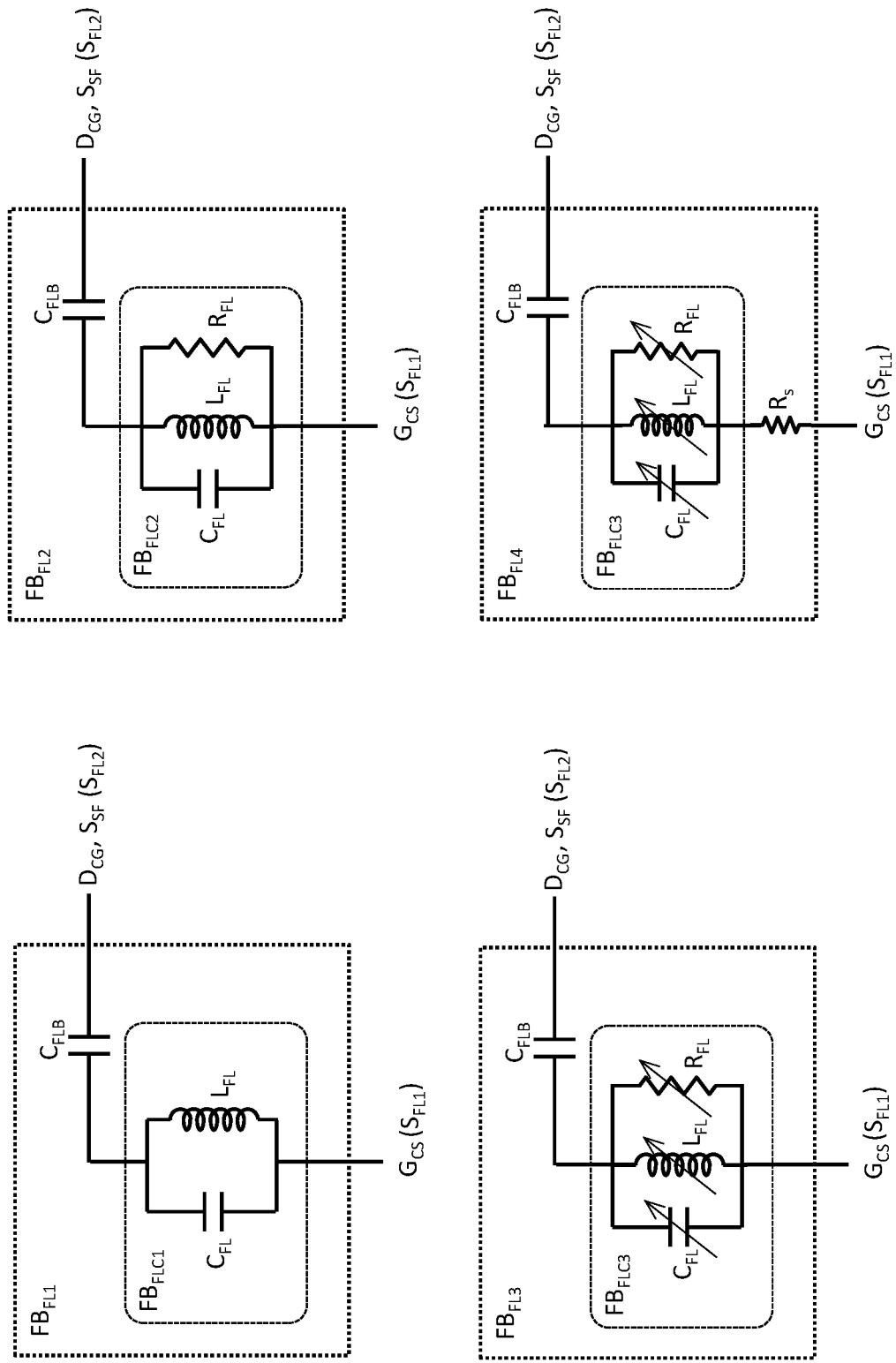
FIG. 3 shows four exemplary implementations of a feedback filter according to the present disclosure.

FIG. 3 shows four exemplary implementations (e.g., $FB_{FL1}$, $FB_{FL2}$, $FB_{FL3}$, $FB_{FL4}$) of a feedback filter according to the present disclosure that may be used as the filter circuit $FB_{FL}$ in the LNAs (200A-200F) described above with reference to FIGS. 2A-2F. In other words, any of the filters $FB_{FL1}$, $FB_{FL2}$, $FB_{FL3}$, or $FB_{FL4}$ shown in FIG. 3 may be used as a feedback circuit in the LNA according to the present teachings, coupled (e.g., selectively) between output nodes (e.g., $D_{CG}$, $S_{SF}$) and input node (e.g., $G_{CS}$) of the LNA. As shown in FIG. 3, included with such filter circuits may be a DC blocking capacitor (e.g., $C_{FLB}$) that serves to isolate DC levels between input and output of the LNA through the feedback filter. Effective filtering may be provided by respective resonant circuits (e.g., $FB_{FLC1}$, $FB_{FLC2}$, $FB_{FLC3}$, $FB_{FL4}$, notch filters) that include a parallel combination of an inductor, $L_{FL}$, and a capacitor, $C_{FL}$, (e.g., L-C tank) configured to resonate at a frequency of interest, such as, for example, a (center) frequency of operation of a band (e.g., from frequency bands $B_a$, $B_b$, ..., $B_k$ of FIGS. 1A-1B).

With continued reference to FIG. 3, in some embodiments, as shown in the filter $FB_{FL2}$, a q-factor of the L-C tank ($L_{FL}$, $C_{FL}$) may be reduced by arranging a resistor, $R_{FL}$, in parallel with the L-C tank, thereby effectively widening a passband of the filter. In some embodiments, as shown in the filter $FB_{FL3}$, one or more of the inductor, $L_{FL}$, the capacitor, $C_{FL}$, and/or the resistor, $R_{FL}$, may be tunable/adjustable/settable/programmable, so to provide a tunable/adjustable/settable/programmable resonance (i.e., resonant frequency), and therefore frequency response of the filter. In some embodiments, as shown in the filter $FB_{FL4}$, a series resistor, $R_S$, may be used to couple the filter (e.g., $FB_{FL4}$) to the input node (e.g., $G_{CS}$) of the LNA. Such series resistor, $R_S$, may reduce instabilities arising from a (parasitic) resonance generated by a combination of the capacitor, $C_{FLB}$, with the L-C tank (e.g., $FB_{FLC3}$), by reducing a crosstalk between input and output sides of the filter (e.g., $FB_{FL4}$).

Figure 4:
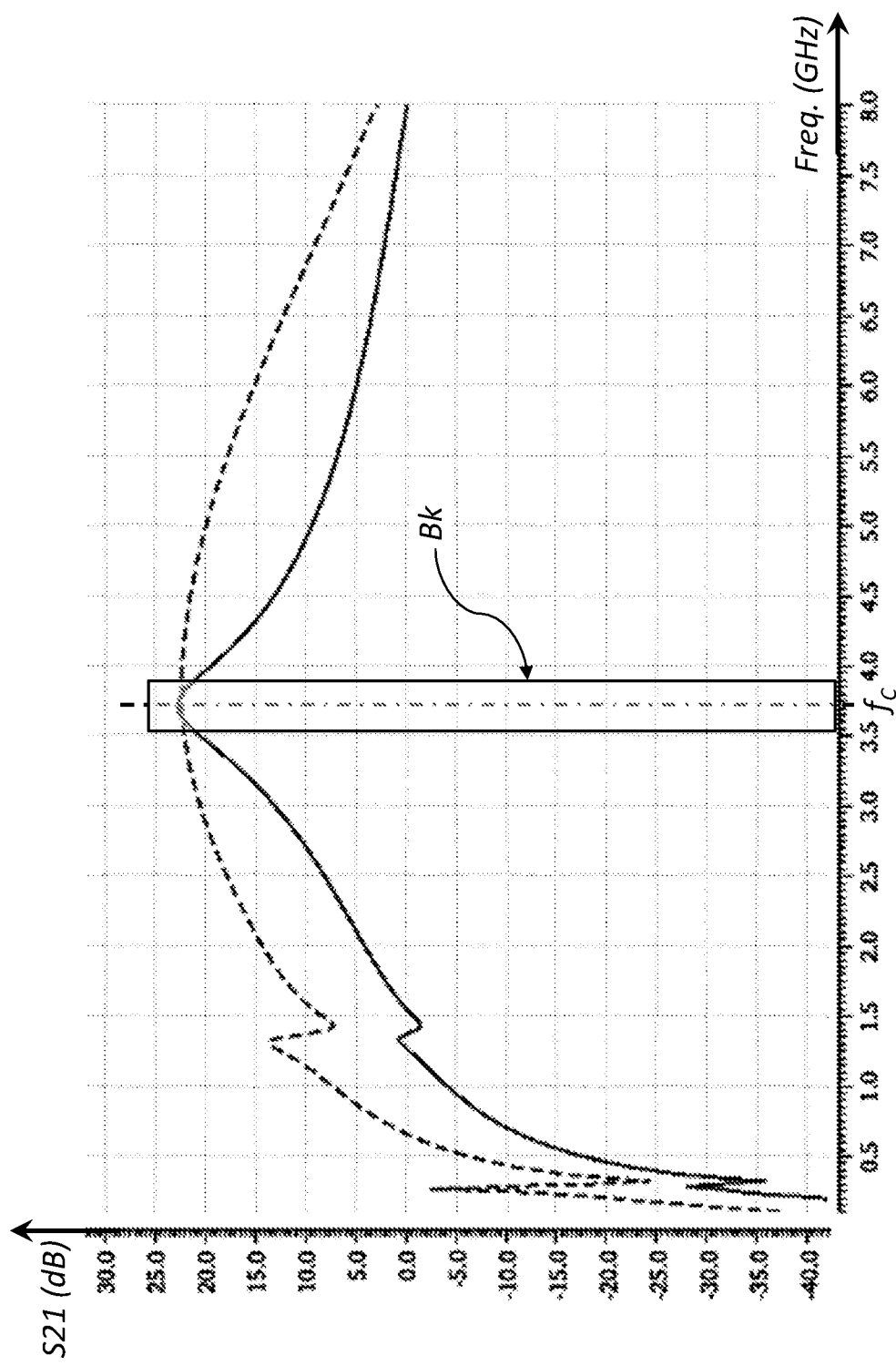
FIG. 4 shows graphs representative of respective performances of the LNA architecture with feedback filtering according to the present disclosure and the prior art LNA architecture of FIG. 1D.

FIG. 4 shows graphs representative of respective performances (S21 versus frequency) of the LNA architecture with feedback filtering according to the present disclosure (e.g., any of FIGS. 2A-2F, shown in solid line) and the prior art (wideband) LNA architecture of FIG. 1D (shown in dash line). As shown in FIG. 4, the feedback filtering according to the present disclosure may provide in-band selectivity (e.g., band $B_k$ about a center frequency, $f_c$) for a narrowband operation of the LNA by attenuating an out-of-band signal. Different values of the center frequency, $f_c$, in correspondence of difference frequency bands can be provided by different (e.g., tunable/adjustable) values of elements of the filter circuit as described above with reference to, for example, FIG. 3.

FIG. 5 shows a simplified schematic of a multi-stage low noise amplifier architecture with feedback filtering (LNA, 500) according to an embodiment of the present disclosure. As previously described, the LNA (500) may represent an exemplary implementation of the LNA (200B) described above with reference to FIG. 2B, with exemplary (and nonlimiting) use of the filter circuit, $FB_{LF4}$, of FIG. 3, that may be selectively coupled between nodes $G_{CS}$ and De of the first stage AP (110) via respective switches $S_{FL1}$ and $S_{FL2}$. Furthermore, the (wideband) feedback circuit, $FB_{WB}$, may be selectively coupled to the first stage AP (100) via a switch $S_{WB1}$ coupled to the input node, $G_{CS}$. During a wideband mode of operation of the LNA (500), the switch $S_{WB1}$ may be closed, and switches ($S_{FL1}$, $S_{FL2}$) may be opened, therefore providing a wideband performance of the LNA (500) according to, for example, the dash graph of FIG. 4. On the other hand, during a narrowband mode of operation of the LNA (500), the switch $S_{WB1}$ may be opened, and the switches ($S_{FL1}$, $S_{FL2}$) may be closed, therefore providing a narrowband performance of the LNA (500) according to, for example, the solid graph of FIG. 4, at a center frequency (e.g., $f_C$) defined by values of elements of the filter, $FB_{LF4}$. As described above with reference to FIG. 3, the series resistor, $R_S$, used in the filter circuit, $FB_{LF4}$, may reduce instabilities arising from a (parasitic) resonance generated by a combination of the capacitor, $C_{FLB}$, with the L-C tank (e.g., $FB_{FLC3}$) during the narrowband mode of operation.

With continued reference to FIG. 5, an in-band resonance that the L-C tank ($L_{FL}$, $C_{FL}$) creates may degrade in-band performance during the wideband mode of operation of the LNA (500). Such performance degradation may be reduced by sizing the switch $S_{FL1}$ (and optionally the switch $S_{FL2}$) for higher isolation in exchange for a/an (undesirable) degradation (e.g., lower) q-factor of the L-C tank ($L_{FL}$, $C_{FL}$) during the narrowband mode of operation. It follows that according to an embodiment of the present disclosure, and as shown in the lower right corner of FIG. 5, the capacitor, $C_{FL}$, of the L-C tank ($L_{FL}$, $C_{FL}$), may be replaced by a switchable configuration, $C'_{FL}$, that may include, in addition to the capacitor, $C_{FL}$, an additional capacitor, $C_{FL1}$, that can be selectively coupled in parallel with the capacitor, $C_{FL}$, via a switch, $S_{CFL}$. A value of the additional capacitor, $C_{FL1}$, may be selected so that a combined capacitance of the capacitors, $C_{FL}$ and $C_{FL1}$, in combination with the inductor, $L_{FL}$, generate an out-of-band resonance to avoid the degradation of in-band performance. Accordingly, the switch, $S_{CFL}$, may be closed during the wideband mode of operation, and open during the narrowband mode of operation.

With further reference to FIG. 5, as previously described, use of switches for selective coupling of the filter circuit (e.g., $FB_{FL4}$) to the amplification stage may be optional and with some tradeoff. For example, during the wideband mode of operation of the LNA (500), the (open state of the) switch, $S_{FL2}$, may provide higher isolation between the filter circuit (e.g., $FB_{FL4}$) and the (drain) node, $D_{CG}$, which may result in a higher gain. On the other hand, during the narrowband mode of operation of the LNA (500), the (closed state of the) switch, $S_{FL2}$, may introduce an additional series resistance that may degrade the q-factor of the of the L-C tank ($L_{FL}$, $C_{FL}$) and therefore degrade filtering performance.

Figure 6:
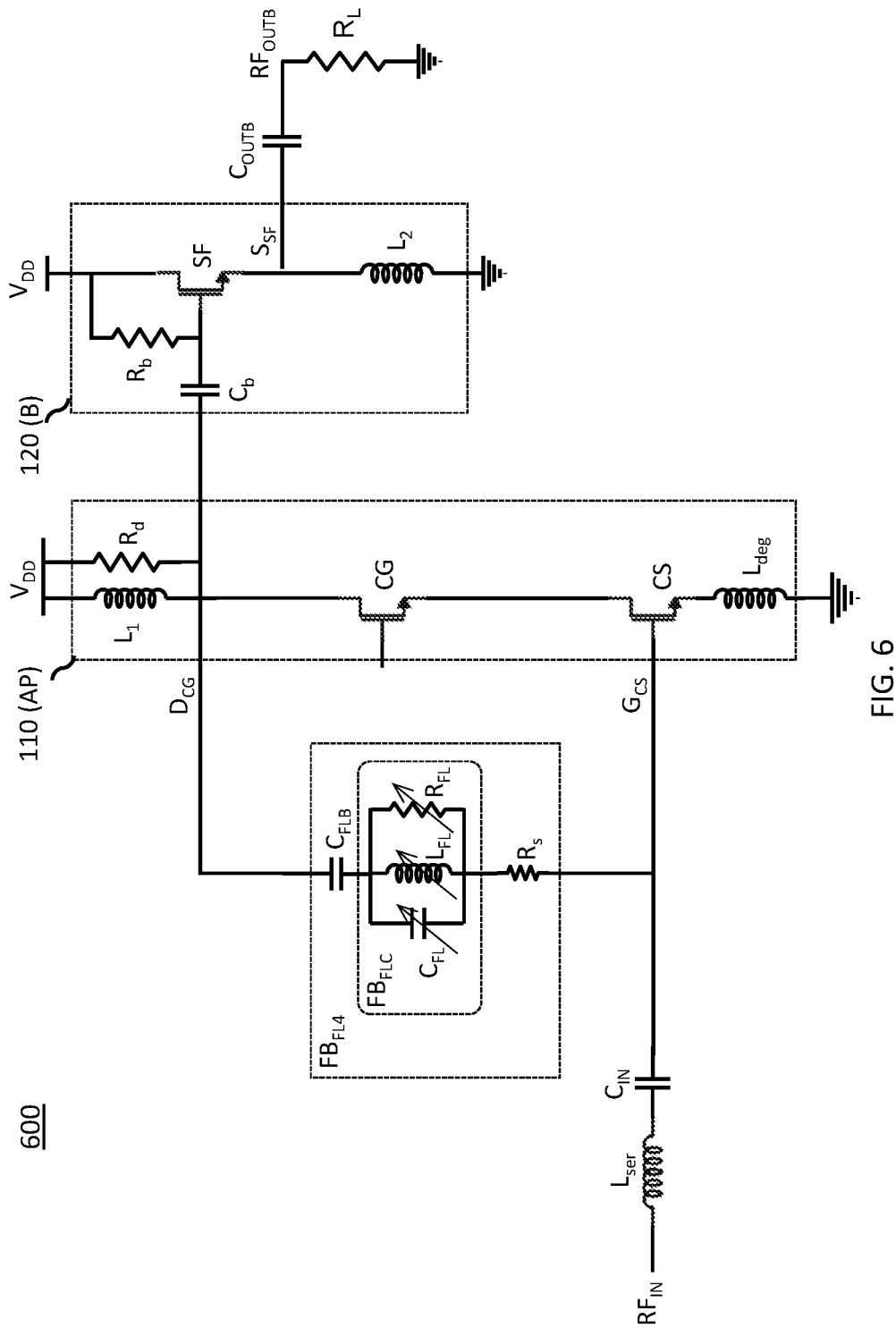
FIG. 6 shows a simplified schematic of a multi-stage stage LNA architecture with feedback filtering according to another embodiment of the present disclosure.

FIG. 6 shows a simplified schematic of a multi-stage low noise amplifier architecture with feedback filtering (LNA, 600) according to an embodiment of the present disclosure. As previously described, the LNA (600) may represent an exemplary implementation of the LNA (200B) described above with reference to FIG. 2B, with exemplary (and nonlimiting) use of the filter circuit, $FB_{LF4}$, of FIG. 3, that may be (permanently) coupled between nodes $G_{CS}$ and $D_{CG}$ of the first stage AP (110). Furthermore, absence of the (wideband) feedback circuit (e.g., $FB_{WB}$ of FIG. 5) may not provide support for a wideband mode of operation of the LNA (600).

FIG. 7 shows a simplified schematic of a single-stage low noise amplifier architecture with feedback filtering (LNA, 700) according to an embodiment of the present disclosure. As previously described, the LNA (700) may represent an exemplary implementation of the LNA (200C) described above with reference to FIG. 2C, with exemplary (and nonlimiting) use of the filter circuit, $FB_{LF4}$, of FIG. 3, that may be (permanently) coupled between nodes $G_{CS}$ and $D_{CG}$ of the first stage AP (710). Furthermore, absence of the (wideband) feedback circuit (e.g., $FB_{WB}$ of FIG. 5) may not provide support for a wideband mode of operation of the LNA (700). As can be seen in FIG. 7, output RF signal of the LNA (700) is provided through the node, $D'_{CG}$, that is coupled to the drain node, $D_{CG}$, via an inductor, $L_3$. As previously described, the node, $D'_{CG}$, may provide a better output matching of the LNA (700) while reducing effects of impedance changes/variation provided by (the tuning of) the filter circuit, $FB_{FL4}$. According, and in contrast to the LNA (600) of FIG. 6, the output RF signal, $RF_{OUT4}$, of the LNA (700) may be directly taken from the node, $D'_{CG}$ (and without need for the buffering stage 120 of FIG. 6).

FIG. 8 shows a simplified schematic of a multi-stage low noise amplifier architecture with feedback filtering (LNA, 800) according to an embodiment of the present disclosure. As previously described, the LNA (800) may represent an exemplary implementation of the LNA (200D) described above with reference to FIG. 2D, with exemplary (and nonlimiting) use of the filter circuit, $FB_{LF2}$, of FIG. 3, that may be (selectively) coupled between node $G_{CS}$ (e.g., via capacitor $C_{IN}$) of the first stage AP (710) and node $S_{SF}$ of the second stage (120). Wideband mode of operation of the LNA (800) may be provided via (permanent) coupling of the circuit, $FB_{WB}$, between nodes $G_{CS}$ and $D_{CG}$ of the first stage AP (710). Furthermore, input to the second stage B (120) may be coupled to the node D'cc of the first stage AP (710).

With continued reference to FIG. 8, for operation according to the wideband mode of the LNA (800), the switches ($S_{FL1}$, $S_{FL2}$, $S_{OUT4}$) may be opened and the switch $S_{OUTB}$ may be closed to effectively provide a (wideband) output signal, $RF_{OUTB}$. On the other hand, for operation according to the narrowband mode of the LNA (800), the switches ($S_{FL1}$, $S_{FL2}$, $S_{OUT4}$) may be closed and the switch $S_{OUTB}$ may be opened to effectively provide a (narrowband) output signal, $RF_{OUT4}$. In this case, a corresponding narrowband (frequency) response of the LNA (800) may be provided by attenuation, via the filter circuit (e.g., $FB_{FL2}$), of an out-of-band (wideband) signal provided by the circuit, $FB_{WB}$.

With further reference to FIG. 8, during the wideband mode of operation, the LNA (800) may be considered as a two-stage amplifier, including first stage (710) cascaded with second stage (120). On the other hand, during the narrowband mode of operation, the LNA (800) may be considered as a single-stage amplifier based on the stage (710), with a feedback circuit coupled between the input and output nodes of the stage (710), wherein the feedback circuit includes the buffer stage (120) in series coupled to the filter circuit (e.g., $FB_{FL2}$). In other words, the LNA (800) may be considered as a configurable LNA that uses the buffer stage (120) as a second (amplification) stage during the wideband mode of operation, and as a feedback element during the narrowband mode of operation.

It should be noted that the above-described LNA architectures with feedback filtering (e.g., 500, 600, 700, 800) may represent some exemplary implementations based on the block diagrams of FIGS. 2A-2F. Other architectures based on different combinations of the filter circuit (e.g., any one of $FB_{FL1}$, $FB_{FL2}$, $FB_{FL3}$ or $FB_{FL4}$), coupling switches (e.g., any one or more of $S_{WB1}$, $S_{WB2}$, $S_{FL1}$, $S_{FL2}$), and presence or absence of the circuit $FB_{WB}$, may be possible in view of target design goals and performances. For example, FIG. 9 represents an LNA architecture (900) based on the LNA architecture (800) of FIG. 8 that may support only narrowband operation based on the (permanent) coupling of the feedback circuit (120, $FB_{FL2}$) between the input and output nodes of the stage (710).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other 2-D and 3-D transistor technologies such as bipolar junction transistors (BJTs), BICMOS, LDMOS, BCD, GaAs HBT, GaN HEMT, GaAs pHEMT, MESFET, InP HBT, InP HEMT, FinFET, GAAFET, and SiC-based power device technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for case of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A low noise amplifier (LNA) circuit, comprising:
a first amplification stage configured to receive an input radio frequency (RF) signal at an input of the first amplification stage and generate therefrom an amplified RF signal at an output of the first amplification stage; and
a filter circuit comprising an L-C tank, the filter circuit coupled between the output and the input of the first amplification stage,
wherein:
the L-C tank is configured to resonate at a resonant frequency to provide a narrowband frequency response of the LNA circuit; and
the L-C tank includes at least one tunable inductor or capacitor configured to tune the resonant frequency.

2. The low noise amplifier (LNA) circuit of claim 1, wherein:
the filter circuit further comprises a resistor in parallel with the L-C tank.

3. The low noise amplifier (LNA) circuit of claim 1, wherein:
the filter circuit further comprises a resistor that couples the input of the first amplification stage to the L-C tank.

4. The low noise amplifier (LNA) circuit of claim 1, wherein:
the filter circuit further comprises a capacitor that couples the output of the first amplification stage to the L-C tank.

5. The low noise amplifier (LNA) circuit of claim 1, wherein:
the filter circuit further comprises an additional tank capacitor that is selectively coupled, via a switch, in parallel with a tank capacitor and a tank inductor of the L-C tank, and
a combined capacitance of the additional tank capacitor and the tank capacitor, in combination with an inductance of the tank inductor, is configured to resonate at a resonant frequency that is outside of the narrowband frequency response of the LNA circuit.

6. The low noise amplifier (LNA) circuit of claim 1, further comprising:
a second amplification stage comprising a source-follower, an input to the second amplification stage coupled to the output of the first amplification stage.

7. The low noise amplifier (LNA) circuit of claim 6, wherein:
the second amplification stage is configured to buffer the first stage amplified RF signal.

8. The low noise amplifier (LNA) circuit of claim 6, wherein:
the filter circuit is coupled to an output of the second amplification stage,
the filter forms a feedback circuit between an output of the second amplification stage and the input of the first amplification stage, and
an output of the LNA circuit is provided at the output of the second amplification stage.

9. The low noise amplifier (LNA) circuit of claim 6, wherein:
the filter circuit is coupled to an output of the second amplification stage, and
the filter circuit and the second amplification stage form a feedback circuit between the output of the first amplification stage and the input of the first amplification stage.

10. The low noise amplifier (LNA) circuit of claim 9, wherein:
the feedback circuit is selectively coupled between the output of the first amplification stage and the input of the first amplification stage via at least one switch coupled to the filter circuit,
during a narrowband mode of operation of the LNA circuit, the at least one switch is closed, and an output of the LNA circuit is provided by the amplified RF signal at the output of the first amplification stage, and
during a wideband mode of operation of the LNA circuit, the at least one switch is open, and the output of the LNA circuit is provided by a buffered version of the first stage amplified RF signal at the output of the second amplification stage.

11. The low noise amplifier (LNA) circuit of claim 1, further comprising:
a wideband circuit comprising a resistor in series connection with a capacitor, the wideband circuit coupled between the output of the first amplification stage and the input of the first amplification stage,
wherein
the wideband circuit is configured to provide a wideband frequency response of the LNA.

12. The low noise amplifier (LNA) circuit of claim 11, wherein:
at least one of the filter circuit or the wideband circuit is selectively coupled to the first amplification stage via a respective one or more switches.

13. The low noise amplifier (LNA) circuit of claim 11, wherein:
the filter circuit and the wideband circuit are selectively coupled to the first amplification stage via respective one or more switches.

14. The low noise amplifier (LNA) circuit of claim 1, wherein:
the first amplification stage comprises a common-source amplifier in series connection with a common-gate amplifier, and
the filter circuit is connected between a drain of the common-gate amplifier and a gate of the common-source amplifier.

15. The low noise amplifier (LNA) circuit of claim 14, wherein:
the output of the first amplification stage is coupled to a supply voltage through a first inductor.

16. The low noise amplifier (LNA) circuit of claim 15, wherein:
the output of the first amplification stage is coupled to the drain of the common-gate amplifier through a second inductor that is in series connection with the first inductor.

17. A low noise amplifier (LNA) circuit, comprising:
a first amplification stage that receives an input radio frequency (RF) signal at an input of the first amplification stage and provides an amplified RF signal at an output of the first amplification stage; and
a filter circuit comprising an L-C tank, the filter circuit coupled between the output and the input of the first amplification stage,
wherein:
the L-C tank is configured to resonate at a resonant frequency; and
the L-C tank includes at least one tunable inductor or capacitor configured to tune the resonant frequency.

18. The low noise amplifier (LNA) circuit of claim 17, wherein:

tuning of the resonant frequency is configured to tune a frequency response of the LNA circuit for operation of the LNA circuit according to different frequency bands.

19. A low noise amplifier (LNA) circuit, comprising:
a first amplification stage comprising a common-source amplifier in series connection with a common-gate amplifier; and
a filter circuit comprising an L-C tank, the filter circuit coupled between a drain of the common-gate amplifier and a gate of the common-source amplifier,
wherein
the L-C tank is configured to resonate at a resonant frequency to provide a narrowband frequency response of the LNA circuit.

20. The low noise amplifier (LNA) circuit of claim 19, further comprising:
a wideband circuit comprising a resistor in series connection with a capacitor, the wideband circuit coupled between the drain of the common-gate amplifier and the gate of the common-source amplifier,
wherein
the wideband circuit is configured to provide a wideband frequency response of the LNA.

21. The low noise amplifier (LNA) circuit of claim 20, further comprising:
a second amplification stage comprising a source-follower, an input to the second amplification stage coupled to the drain of the common-gate amplifier.

22. The low noise amplifier (LNA) circuit of claim 20, wherein:
the filter circuit and the wideband circuit are selectively coupled to the first amplification stage via respective one or more switches,
during a narrowband mode of operation of the LNA circuit, the respective one or more switches are configured to couple the filter circuit to the first amplification stage and decouple the wideband circuit from the first amplification stage, and
during a wideband mode of operation of the LNA circuit, the respective one or more switches are configured to decouple the filter circuit from the first amplification stage and couple the wideband circuit to the first amplification stage.

23. A low noise amplifier (LNA) circuit, comprising:
a first amplification stage comprising a common-source amplifier in series connection with a common-gate amplifier;
a second amplification stage comprising a source-follower, an input to the second amplification stage coupled to the drain of the common-gate amplifier; and
a filter circuit comprising an L-C tank, the filter circuit coupled between an output of the second amplification stage and a gate of the common-source amplifier,
wherein
the L-C tank is configured to resonate at a resonant frequency to provide a narrowband frequency response of the LNA circuit.

24. The low noise amplifier (LNA) circuit of claim 23, further comprising:
a wideband circuit comprising a resistor in series connection with a capacitor, the wideband circuit coupled between the drain of the common-gate amplifier and the gate of the common-source amplifier,
wherein
the wideband circuit is configured to provide a wideband frequency response of the LNA.

25. The low noise amplifier (LNA) circuit of claim 24, wherein:
the filter circuit is selectively coupled to the first amplification stage via at least a first switch,
the filter circuit is selectively coupled to the second amplification stage via at least a second switch,
during a narrowband mode of operation of the LNA circuit, the at least first and second switches are configured to couple the filter circuit to the first and second amplification stages, and
during a wideband mode of operation of the LNA circuit, the at least first and second switches are configured to decouple the filter circuit from the first and second amplification stages.

26. The low noise amplifier (LNA) circuit of claim 25, wherein:
during the narrowband mode of operation of the LNA circuit, a combination of the second amplification stage and the filter circuit forms a feedback circuit between the drain of the common-gate amplifier and the gate of the common-source amplifier, and
during the narrowband mode of operation of the LNA circuit, an output of the LNA circuit is provided at a drain of the common-gate amplifier.

27. The low noise amplifier (LNA) circuit of claim 25, wherein:
during the wideband mode of operation of the LNA circuit, an output of the LNA circuit is provided at the output of the second amplification stage.

* * * * *